United States Patent [19]

Kasahara et al.

[11] Patent Number: 4,837,605
[45] Date of Patent: Jun. 6, 1989

[54] INDIUM-PHOSPHIDE HETERO-MIS-GATE FIELD EFFECT TRANSISTOR

[75] Inventors: Kensuke Kasahara; Tomohiro Itoh; Keiichi Ohata, all of Tokyo, Japan

[73] Assignee: NEC Corporation, Tokyo, Japan

[21] Appl. No.: 130,575

[22] Filed: Dec. 9, 1987

[30] Foreign Application Priority Data

Dec. 9, 1986 [JP] Japan ............................... 61-293853

[51] Int. Cl.$^4$ ..................... H01L 29/80; H01L 29/205
[52] U.S. Cl. ........................................ 357/22; 357/16; 357/15; 357/61; 357/23.2
[58] Field of Search ........................ 357/16, 22, 15, 61, 357/23.2

[56] References Cited

U.S. PATENT DOCUMENTS

| 4,117,504 | 9/1978 | Maslov et al. | 357/16 |
| 4,745,447 | 5/1988 | Chen et al. | 357/16 |
| 4,757,358 | 7/1988 | Hovel et al. | 357/22 |

OTHER PUBLICATIONS

Ohno et al., *IEEE Elec. Dev. Letters*, vol. EDL-1, No. 8, Aug. 1980, "Double Hetero Ga$_{.47}$In$_{.53}$As MESFETS by MBE", pp. 154–155.

*Primary Examiner*—Andrew J. James
*Assistant Examiner*—Jerome Jackson, Jr.
*Attorney, Agent, or Firm*—Sughrue, Mion, Zinn, Macpeak & Seas

[57] ABSTRACT

For improvement in gate leakage current, there is disclosed a hetero-MIS gate type field effect transistor comprising (a) an indium-phosphide semi-insulating substrate, (b) an indium-phosphide active layer formed on a surface of the semi-insulating substrate, (c) an aluminum-gallium-arsenide layer formed on a surface of the indium-phosphide active layer, (d) a metal gate electrode formed on the aluminum-gallium-arsenide layer, and (e) source and drain electrodes formed on the indium-phosphide active layer and located at the both sides of the metal gate electrode, and the aluminum-gallium-arsenide layer has the highest aluminum atom composition at the upper surface portion contacting the metal gate electrode and the lowest aluminum atom composition at the lower surface portion contacting the indium-phosphide active layer, so that a discontinuity takes place between the indium-phosphide active layer and the aluminum-gallium-arsenide layer and a higher Schottky barrier is provided between the aluminum-gallium-arsenide layer and the gate electrode, thereby preventing the field effect transistor from the large gate leakage current.

8 Claims, 5 Drawing Sheets

PRIOR-ART

PRIOR-ART

INDIUM-PHOSPHIDE HETERO-MIS-GATE FIELD EFFECT TRANSISTOR

FIELD OF THE INVENTION

This invention relates to a field effect transistor and, more particularly, to the structure of an indium-phosphide hetero-MIS (metal-insulator-semiconductor) field effect transistor.

BACKGROUND OF THE INVENTION

Although indium-phosphide compound semiconductor has a lower Schottky barrier height than that of gallium-arsenide compound semiconductor, it is well known in the art that indium-phosphide compound semiconductor is advantageous over gallium-arsenide compound semiconductor in that indium-phosphide compound semiconductor is larger in saturation velocity and in thermal conductivity than gallium-arsenide and that indium-phosphide compound semiconductor is smaller in ionization coefficient than gallium-arsenide. For this reason, research and development efforts are underway toward applying an indium-phosphide compound semiconductor crystal to a material such as, for example, an indium-phosphide semi-insulating substrate or an indium-phosphide active layer for a ultra-high-cutoff frequency high-power semiconductor device or a ultra-high-speed semiconductor device.

In general, there are three types of strutures for field effect transistors using compound semiconductor material, i.e., MES (metal-semiconductor) gate structure type, MIS (metal-insulator-semiconductor) gate structure type and a p-n junction type. A typical example of the MES gate structure type field effect transistor is illustrated in FIG. 1 and comprises an indium-phosphide semi-insulating substrate 1, an indium-phosphide active layer 2 grown on the upper surface of the semi-insulating substrate 1, a metal gate electrode 3 formed on the active layer 2 and source and drain electrodes 4 and 5. The metal gate electrode 3 is formed of aluminum, and the indium-phosphide active layer 2 provides a metal-semiconductor contact with a Schottky-barrier height of about 0.3 to 0.4 eV. Another MES gate structure type field effect transistor is disclosed by J. S. Barrera et al in "InP Schottky-Gate Field-Effect Transistors", IEEE Transaction on Electron Devices, vol. ED-22, No. 11, November 1975.

FIG. 2 shows a conventional MIS gate structure type field effect transistor which comprises an n+indium-phosphide semi-insulating substrate 11, an indium-phosphide contact layer 12 partially removed to expose the semi-insulating substrate 11, a gate insulating film 13 of silicon dioxide deposited on the exposed surface of the semi-insulating substrate 11, a gate electrode 14 provided on the gate insulating film 13, and source and drain electrodes 15 and 16 formed on the contact layer 12. Another MIS gate structure type field effect transistor is disclosed by D. L. Lile et al in "n-Channel Inversion-Mode InP M.I.S.F.E.T.", Electron Letters, Sept. 28 1978, Vol. 14, No. 20, pages 657 to 659.

The prior-art MES gate structure type field effect transistors have a problem in reverse current flowing between the metal gate and the drain as described in the above paper written by J. S. Barrera et al. This is because of the fact that the MES gate structure type field effect transistor has a relatively low Schottky-barrier height between the gate electrode and the active layer. The MES gate structure type field effect transistor further has a problem in gate break down voltage. On the other hand, the prior-art MIS gate structure type field effect transistor does not have the problems in reverse leakage current and low gate break down voltage; however, another problem is encountered in the operation mode and drift of channel current. Namely, the MIS gate structure type field effect transistor has a large amount of surface states which result in pinning of Fermilevel, so that the MIS gate structure type field effect transistor can usually provide only a normally-off type device, (which is reported in the above mentioned paper written by Lile et al). As to the p-n type field effect transistor, it is possible to fabricate both the normally-on and normally-off types; however, a large amount of leakage current takes place across the p-n junction.

SUMMARY OF THE INVENTION

It is therefore an important object of the present invention to provide a compound semiconductor field effect transistor which is free from the problems inherent in the prior-art compound semiconductor field effect transistors.

It is another important object of the present invention to provide a high-speed high-power compound semiconductor field effect transistor with a high break down voltage.

To accomplish these objects, the present invention proposes to intervene a grading layer of a non-doped aluminum gallium arsenide between the indium-phosphide active layer and the metal gate electrode.

In accordance with the present invention, there is provided an indium-phosphide hetero-MIS gate field effected transistor comprising (a) an indium-phosphide semi-insulating substrate, (b) an indium-phosphide active layer formed on a surface of the semi-insulating substrate, (c) an aluminum-gallium-arsenide layer formed on a surface of the indium-phosphide active layer, (d) a metal gate electrode formed on the aluminum-gallium-arsenide layer, and (e) source and drain electrodes formed on the indium-phosphide active layer and located at both sides of the metal gate electrode, wherein the aluminum-gallium-arsenide layer has the highest aluminum atom composition at the upper surface portion contacting the metal gate electrode and the lowest aluminum atom composition at the lower surface portion contacting the indium-phosphide active layer.

The upper surface portion may be represented by $Al_{0.4}Ga_{0.6}As$, and the lower surface portion may be represented by $Al_xGa_{1-x}As$ where x is approximately equal to 0.

In an implemention, the aluminum-gallium-arsenide layer has a composition of aluminum atoms successively decreased from the upper surface portion to a lower surface portion contacting the active layer. In another implementation, the aluminum-gallium-arsenide layer has a distribution of aluminum atoms stepwise decreased from the upper surface portion to a lower surface portion contacting the active layer.

The gate electrode of the Schottky gate type field effect transistor may be formed of aluminum. The indium-phosphide active layer may be doped with n-type impurity atoms of about $1 \times 10^{17}$ atoms/cm$^3$.

BRIEF DESCRIPTION OF THE DRAWINGS

The features and advantages of an indium-phosphide hetero-MIS gate field effect transistor according to the present invention will be more clearly understood from the following description taken in conjunction with the accompanying drawings in which.

DECRIPTION OF THE PREFERRED EMBODIMENTS

Figure 1:
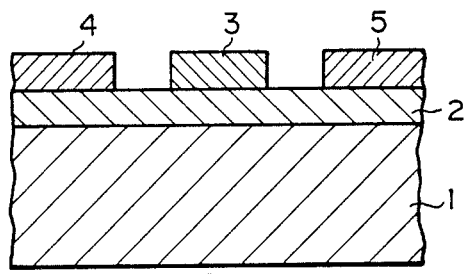
FIG. 1 is a cross sectional view showing the structure of a typical MES gate structure type field effect transistor.
Figure 2:
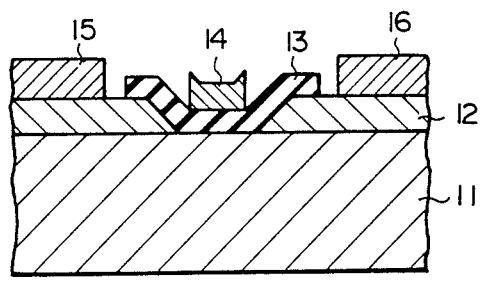
FIG. 2 is a cross sectional view showing the structure of a typical MIS gate structure type field effect transistor.
Figure 3:
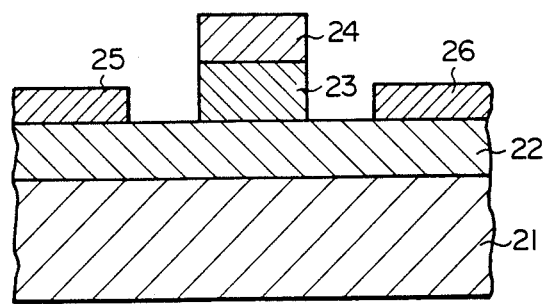
FIG. 3 is a cross sectional view showing the structure of an indium-phosphide hetero-MIS gate type field effect transistor embodying the present invention.

Referring first to FIG. 1 of the drawings, there is illustrated a hetero-MIS gate type field effect transistor embodying the present invention. The hetero-MIS gate field effect transistor illustrated in FIG. 3 comprises a semi-insulating substrate 21 of an indium-phosphide (InP), an n-type indium-phosphide active layer 22 formed on the semi-insulating substrate 21 for providing a channel, an aluminum-gallium-arsenide ($Al_xGa_{1-x}As$) layer 23 formed on an upper surface of the n-type indium-phosphide active layer 22, a metal gate electrode 24 of aluminum formed on the aluminum-gallium-arsenide layer 23, source and drain electrode 25 and 26 of aurum-germanium-nickel (Au-Ge-Ni) formed on the upper surface of the indium-phosphide active layer 22 and located at both sides of the gate electrode 24. Thus, the aluminum-gallium-arsenide layer 23 is sandwiched between the indium-phosphide active layer 22 and the metal gate electrode 24 and, for this reason, the aluminum-gallium-arsenide layer 23 has a lower surface portion contacting the active layer 22 and an upper surface portion contacting the metal gate electrode 24. In this instance, "x" of $Al_xGa_{1-x}As$ is successively decreased from the upper surface portion to the lower surface portion, and "x" is selected to be 0.4 in the upper surface portion and approximately equal to zero in the lower surface portion of the aluminum-gallium-arsenide layer 23. However, "x" may be stepwise decreased from the upper surface to the lower surface in another implementation.

Figure 4A:
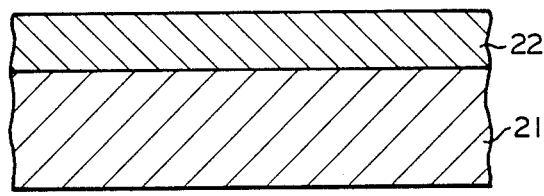
FIGS. 4A to 4D are cross sectional views showing the steps of a fabrication process for the hetero-MIS gate type field effect transistor illustrated in FIG. 3.
Figure 4B:
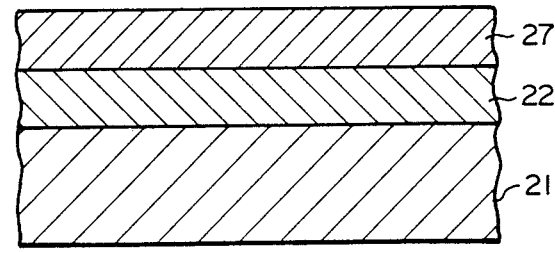
Figure 4C:
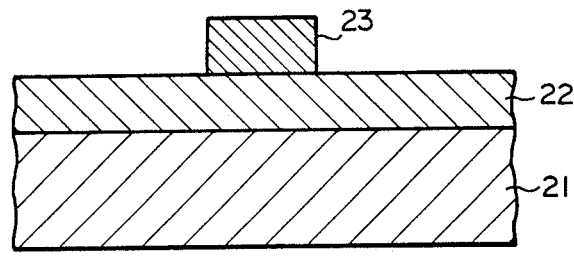
Figure 4D:
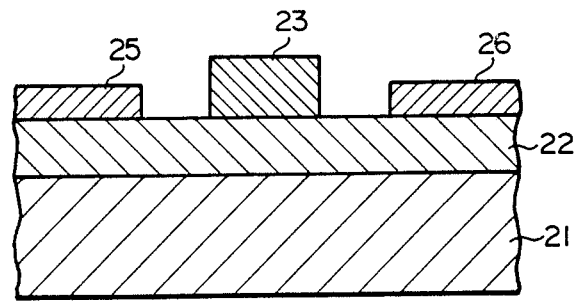

In a fabrication process, the starting material is a (100)-oriented Fe-doped semi-insulating indium-phosphide substrate 21, and an indium-phosphide doped with n-type impurity atoms of about $1\times10^{17}$ atoms/cm$^3$ is epitaxially grown to a thickness of about 200 angstroms by using a vapor phase epitaxial technique. Then, the indium-phosphide active layer 22 is formed on the semi-insulating substrate 21 and the resultant structure is illustrated in FIG. 4A. An aluminum-gallium-arsenide layer 27 ($Al_xGa_{1-x}As$) is grown to a thickness of about 1000 angstroms by using an MBE (molecular-beam-epitaxy) technique as will be seen from FIG. 4B. In the aluminum-gallium-arsenide layer 27, "x" is successively increased from the lower surface portion to the upper surface portion by controlling the composition profiles of aluminum and gallium. Thereafter, the aluminum-gallium-arsenide layer 27 is partially removed to expose the upper surface of the active layer 22 by using lithography techniques and, then, the aluminum-gallium-arsenide ($Al_xGa_{x-1}As$) layer 23 with above described composition profiles is formed on the active layer 22 (see FIG. 4C). The subsequent step is the formation of the source and drain electrodes 25 and 26 by using a lift-off technique. Namely, the inverse pattern of the source and drain electrodes 25 and 26 is formed as a mask by lithography techniques, and the Au-Ge-Ni alloy is deposited thereon. The resultant structure is illustrated in FIG. 4D. The metal gate electrode is formed by repeating the lift-off technique.

Figure 5:
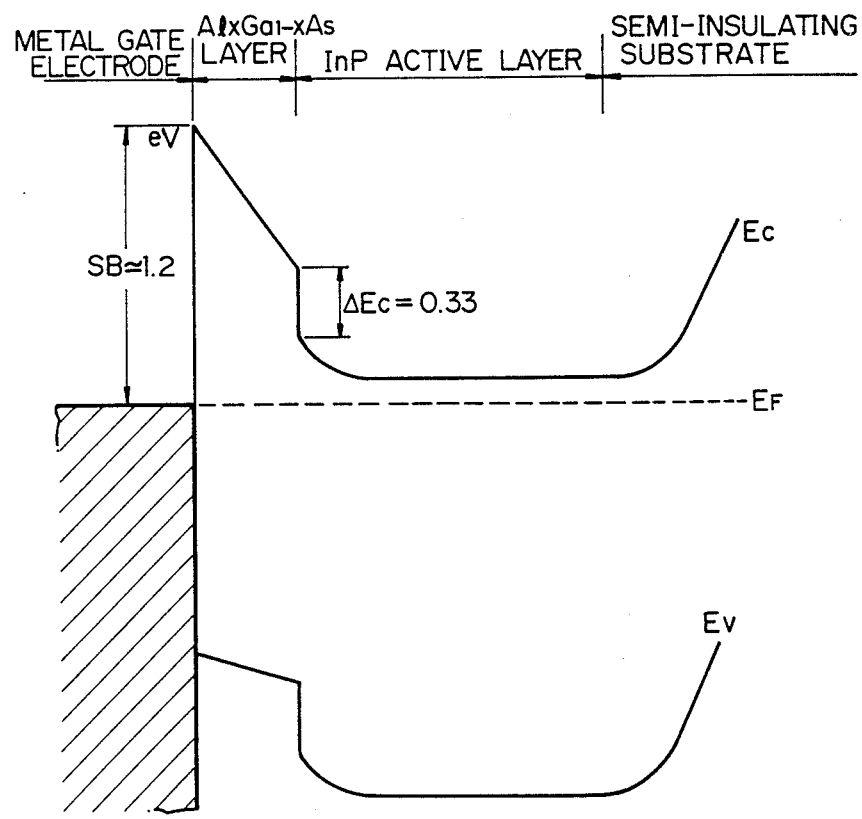
FIG. 5 is an energy band diagram of the indium-phosphide hetero-MIS gate field effect transistor illustrated in FIG. 3.
Figure 6:
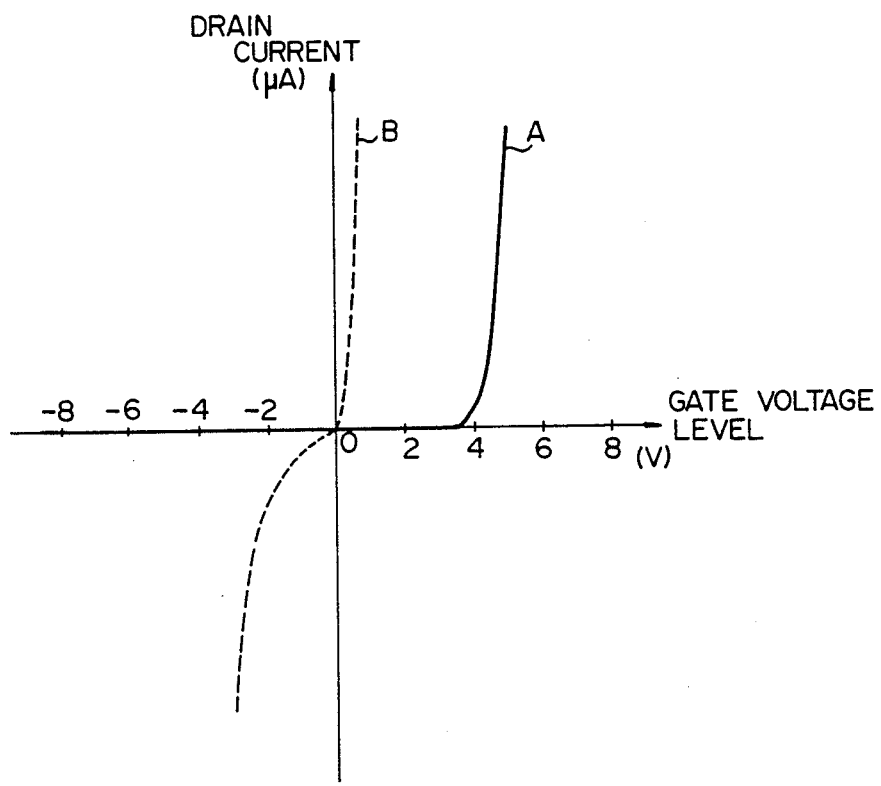
FIG. 6 is a graph showing the relationships between the gate voltages and the drain currents of the field effect transistors illustrated in FIGS. 1 and 3, respectively.

The hetero-MIS gate type field effect transistor thus formed has a discontinuity Ec of about 0.33 eV between the indium-phosphide active layer 22 and the aluminum-gallium-arsenide layer 23 (see FIG. 5) so that electrons in the active layer 22 are blocked by the discontinuity Ec. Moreover, the metal-semiconductor contact between the aluminum-gallium-arsenside layer 23 and the aluminum gate electrode 24 provides a Schottky-barrier height SB of about 1.2 eV and this barrier height SB of about 1.2 eV is high enough to minimize the gate leakage current. As a result, undesirable reverse gate current is effectively reduced by virtue of the high Schottky barrier height SB and the discontinuity Ec. FIG. 6 shows the relationship between the gate voltage level and the drain current observed in the hetero-MIS gate type field effect transistor (plot A). Comparing the plot A with plot B indicating the relationship of the prior-art MES gate structure type field effect transistor illustrated in FIG. 1, it is understood that the hetero-MIS gate type field effect transistor according to the present invention has a large effective turn-on voltage and that the leakage current is sufficiently minimized. Moreover, the plot A implies an extremely large break down voltage value. The interface between the aluminum-gallium-arsenide layer and the indium-phosphide layer is of a heterojunction, so that interface states are very small in number. The hetero-MIS gate type field effect transistor illustrated in FIG. 3 has an extremely narrow hysteresis range of the static characteristics and no serious current drift can be observed.

The hetero-MIS gate type field effect transistor hereinbefore described is of the depletion type field effect transistor having the n-type indium-phosphide active layer 22, however, in an enhancement type implementation, a hetero-MIS gate type field effect transistor has a channel region in a surface portion of a high-purity or lightly-doped indium-phosphide layer or in a surface portion of the indium-phosphide semi-insulating substrate.

As will be understood from the foregoing description, the hetero-MIS gate type field effect transistor according to the present invention has various advantages in operation speed, high cutoff frequency, high power and large break down voltage value over the prior-art compound semiconductor devices.

Although particular embodiments of the present invention have been shown and described, it will be obvious to those skilled in the art that various changes and modifications may be made without departing from the spirit and scope of the present invention.

What is claimed is:

1. A hetero-MIS gate type field effect transistor comprising:

(a) an indium-phosphide semi-insulating substrate;
(b) an indium-phosphide active layer formed on a surface of said semi-insulating substrate;
(c) an aluminum-gallium-arsenide layer on a surface of said indium-phosphide active layer said aluminum-gallium-arsenide layer having a lower surface portion contacting the surface of said indium-phosphide active layer, a potential discontinuity being produced between said indium-phosphide active layer and said aluminum-gallium-arsenide layer;
(d) a metal gate electrode formed on an upper surface portion of said aluminum-gallium-arsenide layer; and
(e) source and drain electrodes formed on said indium-phosphide active layer and located at the both sides of said metal gate electrode, wherein said aluminum-gallium-arsenide layer has the highest aluminum atom composition at the upper surface portion contacting said metal gate electrode and the lowest aluminum atom composition at the lower surface portion contacting said indium-phosphide active layer, wherein said upper surface portion is larger in aluminum content than said lower surface portion.

2. A hetero-MIS gate type field effect transistor as set forth in claim 1, in which said upper surface portion is represented by $Al_xGa_{1-x}As$ where x is 0.4.

3. A hetero-MIS gate type field effect transistor as set forth in claim 1, in which said lower surface portion is represented by $Al_xGa_{1-x}As$ where x is approximately equal to 0.

4. A hetero-MIS gate type field effect transistor as set forth in claim 1, in which said aluminum atoms successively decreased from said upper surface portion to a lower surface portion contacting said active layer.

5. A hetero-MIS gate type field effect transistor as set forth in claim 1, in which said aluminum-gallium-arsenide layer has a composition of aluminum atoms stepwise decreased from said upper surface portion to a lower surface portion contacting said active layer.

6. A hetero-MIS gate type field effect transistor as set forth in claim 1, in which said metal gate electrode is formed of aluminum.

7. A hetero-MIS gate field effect transistor as set forth in claim 1, in which said indium-phosphide active layer has an n-type impurity concentration of about $1 \times 10^{17}$ atoms/cm$^3$.

8. A hetero-MIS gate field effect transistor comprising:
(a) an indium-phosphide semi-insulating substrate;
(b) an indium-phosphide active layer formed on a surface of said semi-insulating substrate and doped with an n-type impurity atoms of about $1 \times 10^{17}$ atoms/cm$^3$;
(c) an aluminum-gallium-arsenide layer formed on a surface of said indium-phosphide active layer and having a lower surface portion contacting said indium-phosphide active layer and an upper surface portion located at the opposite end of said lower surface portion;
(d) a metal gate electrode of aluminum formed on the upper surface portion of said aluminum-gallium-arsenide layer; and
(e) source and drain electrodes formed on said indium-phosphide active layer and located at the both sides of said metal gate electrode, wherein said upper surface portion is represented by $Al_{0.4}Ga_{0.6}As$ and said lower surface portion is represented by $Al_xGa_{1-x}As$ where x is approximately equal to zero.

* * * * *